United States Patent
Shiga et al.

(10) Patent No.: US 6,693,818 B2
(45) Date of Patent: Feb. 17, 2004

(54) SEMICONDUCTOR STORAGE APPARATUS

(75) Inventors: Hitoshi Shiga, Yokohama (JP); Yoshinori Takano, Ichikawa (JP); Toru Tanzawa, Ebina (JP); Shigeru Atsumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/376,848

(22) Filed: Feb. 28, 2003

(65) Prior Publication Data

US 2003/0128593 A1 Jul. 10, 2003

Related U.S. Application Data

(63) Continuation of application No. 10/052,303, filed on Jan. 18, 2002, now Pat. No. 6,552,936.

(30) Foreign Application Priority Data

Jan. 18, 2001 (JP) ........................................ 2001-010242

(51) Int. Cl.$^7$ ................................................ G11C 5/06
(52) U.S. Cl. ................ 365/63; 365/185.22; 365/230.08
(58) Field of Search .............................. 365/63, 180.02, 365/185.22, 221, 230.02, 219, 200, 230.06, 230.08, 239, 185.17, 185.23, 230.01

(56) References Cited

U.S. PATENT DOCUMENTS

| | | | |
|---|---|---|---|
| 5,289,413 A | 2/1994 | Tsuchida et al. ....... | 365/189.02 |
| 5,347,490 A | 9/1994 | Terada et al. ........... | 365/219 |
| 5,761,139 A * | 6/1998 | Shibata et al. ........... | 365/200 |
| 5,986,918 A | 11/1999 | Lee ........................... | 365/103 |
| 6,038,185 A | 3/2000 | Ng et al. .................. | 365/221 |
| 6,240,044 B1 | 5/2001 | Akaogi ..................... | 365/233 |
| 6,243,797 B1 | 6/2001 | Merritt .................... | 711/167 |
| 6,373,748 B2 * | 4/2002 | Ikehashi et al. ........ | 365/185.22 |
| 6,552,936 B2 * | 4/2003 | Shiga et al. ............. | 365/189.02 |

FOREIGN PATENT DOCUMENTS

JP  2000-48586  2/2000

* cited by examiner

*Primary Examiner*—David Nelms
*Assistant Examiner*—Gene Auduong
(74) *Attorney, Agent, or Firm*—Frommer Lawrence & Haug LLP; Grace L. Pan

(57) ABSTRACT

A semiconductor integrated circuit includes first to eighth column selection transistors and ninth to twelfth column selection transistors. The ninth column selection transistor is connected to the first and second column selection transistors. The tenth column selection transistor is connected to the third and fourth column selection transistors. The eleventh column selection transistor is connected to the fifth and sixth column selection transistors. The twelfth column selection transistor is connected to the seventh and eighth column selection transistors. A first column selection line is connected to gates of the first, third, fifth and seventh column selection transistors. A second column selection line is connected to gates of the second, fourth, sixth and eighth column selection transistors. Third to sixth column selection lines are connected to gates of the ninth to twelfth column selection transistors, respectively.

16 Claims, 19 Drawing Sheets

First embodiment (For circulatory serial access)

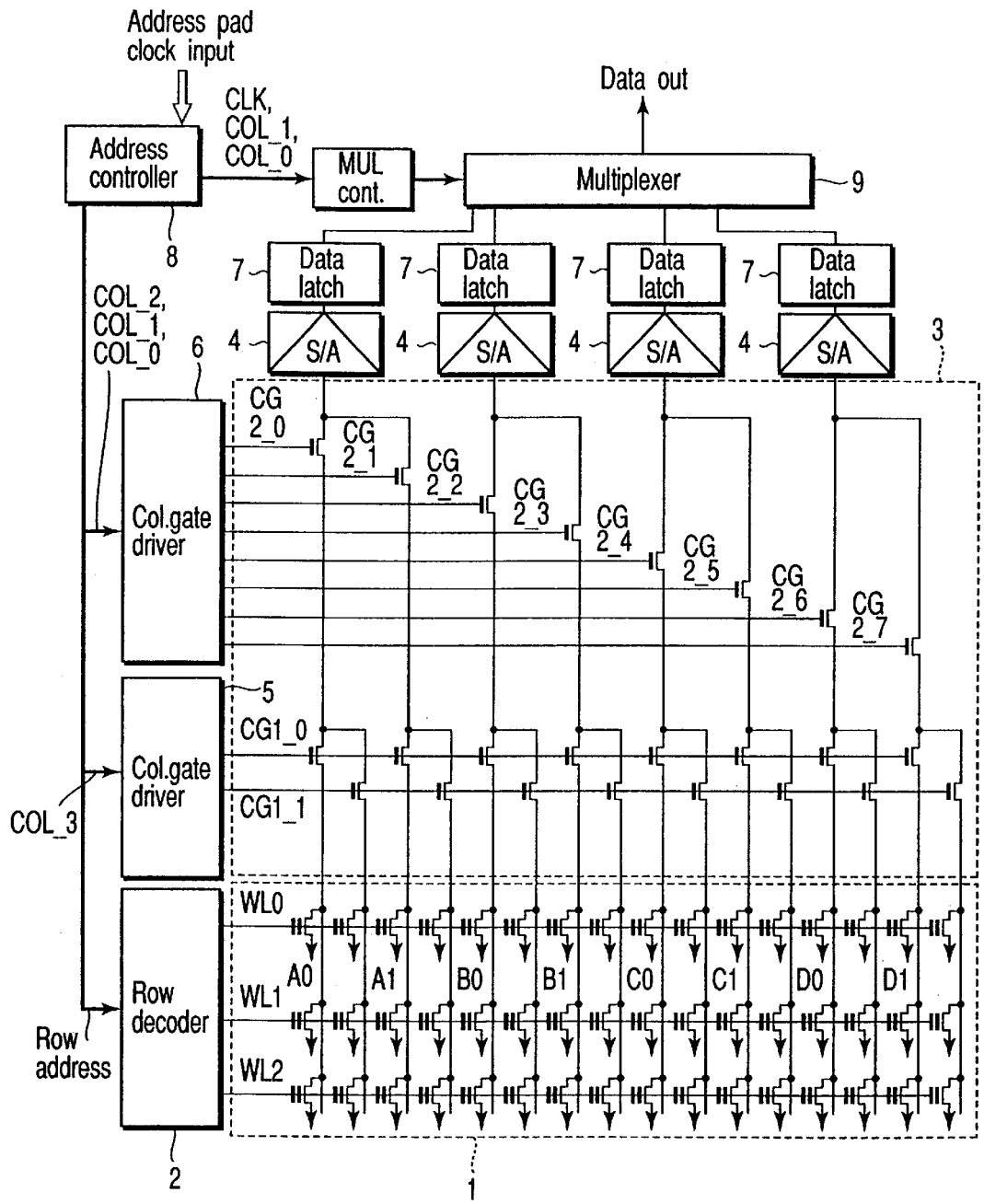
F I G. 1
First embodiment (For circulatory serial access)

| Start address (COL_2,COL_1,COL_0)= decimal | Data output address order (Interleave access) |
|---|---|
| (0,0,0)=0 | 0-1-2-3-4-5-6-7 |
| (0,0,1)=1 | 1-0-3-2-5-4-7-6 |
| (0,1,0)=2 | 2-3-0-1-6-7-4-5 |
| (0,1,1)=3 | 3-2-1-0-7-6-5-4 |
| (1,0,0)=4 | 4-5-6-7-0-1-2-3 |
| (1,0,1)=5 | 5-4-7-6-1-0-3-2 |
| (1,1,0)=6 | 6-7-4-5-2-3-0-1 |
| (1,1,1)=7 | 7-6-5-4-3-2-1-0 |

Access order of circulatory interleave access

FIG. 2

| Start address (COL_2,COL_1,COL_0)= decimal | Data output address order (Continuous access) |
|---|---|
| (0,0,0)=0 | 0-1-2-3-4-5-6-7 |
| (0,0,1)=1 | 1-2-3-4-5-6-7-0 |
| (0,1,0)=2 | 2-3-4-5-6-7-0-1 |
| (0,1,1)=3 | 3-4-5-6-7-0-1-2 |
| (1,0,0)=4 | 4-5-6-7-0-1-2-3 |
| (1,0,1)=5 | 5-6-7-0-1-2-3-4 |
| (1,1,0)=6 | 6-7-0-1-2-3-4-5 |
| (1,1,1)=7 | 7-0-1-2-3-4-5-6 |

Access order of circulatory continuous access

FIG. 3

Column gate driving circuit 6

| COL_2 | 0 | 0 | 0 | 0 | 1 | 1 | 1 | 1 |
|---|---|---|---|---|---|---|---|---|
| COL_1 | 0 | 0 | 1 | 1 | 0 | 0 | 1 | 1 |
| COL_0 | 0 | 1 | 0 | 1 | 0 | 1 | 0 | 1 |
| CG2_0 | H | L | L | L | L | H | H | H |
| CG2_2 | H | H | L | L | L | L | H | H |
| CG2_4 | H | H | H | L | L | L | L | H |
| CG2_6 | H | H | H | H | L | L | L | L |

Truth value with signal INTERLEAVE = "LOW"

Circulatory interleave access operation (pipeline reading)

Address control circuit 8 (For circulatory serial access)

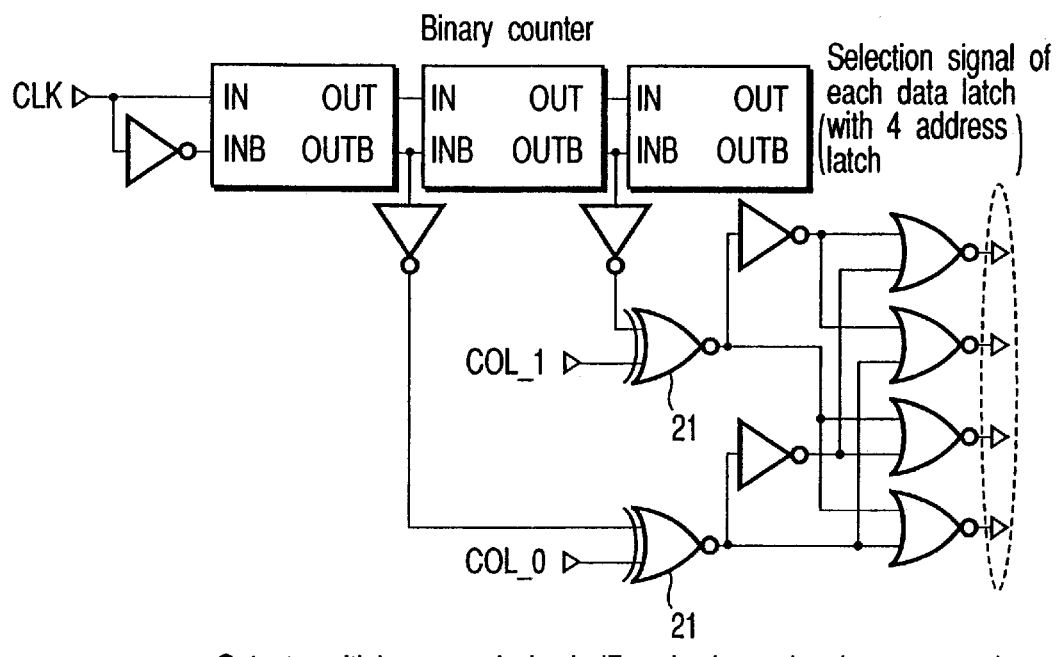
Output multiplex control circuit (For circulatory interleave access)
F I G. 8
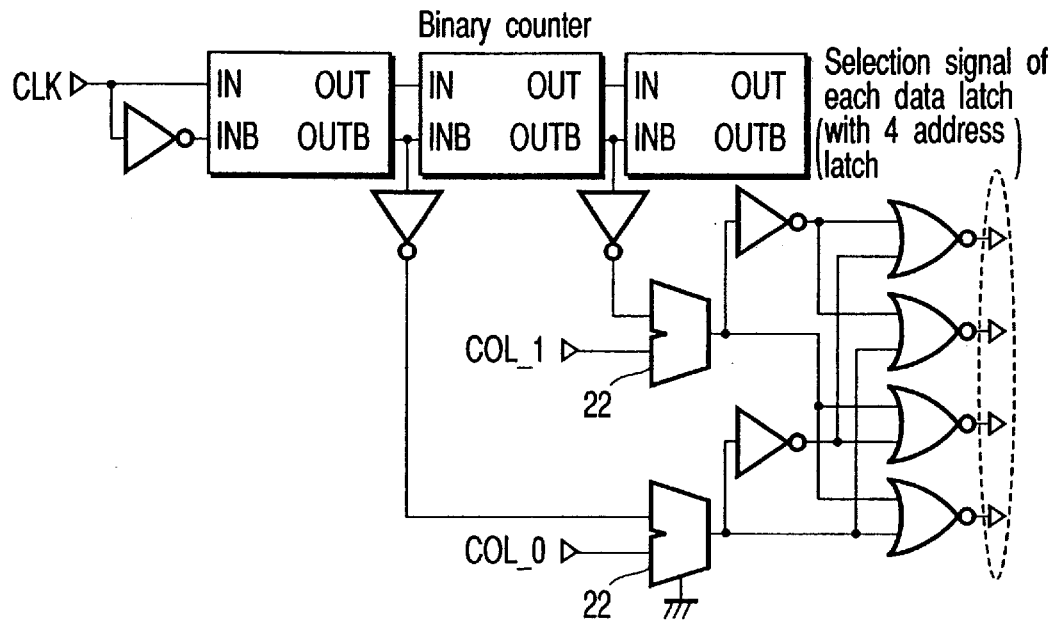
Output multiplex control circuit (For circulatory continuous access)
F I G. 9

| Start address | Selected column gate signal (CG_x) | Selected cell |
|---|---|---|
| (0,0,0)=0 | 0,2,4,6 | 0,1,2,3 |
| (0,0,1)=1 | 1,2,4,6 | 4,1,2,3 |
| (0,1,0)=2 | 1,3,4,6 | 4,5,2,3 |
| (0,1,1)=3 | 1,3,5,6 | 4,5,6,3 |
| (1,0,0)=4 | 1,3,5,7 | 4,5,6,7 |
| (1,0,1)=5 | 0,3,5,7 | 0,5,6,7 |
| (1,1,0)=6 | 0,2,5,7 | 0,1,6,7 |
| (1,1,1)=7 | 0,2,4,7 | 0,1,2,7 |

Combination of simultaneous selection with circulatory continuous access

Circulatory continuous access operation (Pipeline reading)

| Start address(COL_2,COL_1,COL_0)=decimal | Data output address order (Continuous access) |
|---|---|
| (0,0,0)=0 | 0-1-2-3-4-5-6-7 |
| (0,0,1)=1 | 1-2-3-4-5-6-7-8 |
| (0,1,0)=2 | 2-3-4-5-6-7-8-9 |
| (0,1,1)=3 | 3-4-5-6-7-8-9-10 |
| (1,0,0)=4 | 4-5-6-7-8-9-10-11 |
| (1,0,1)=5 | 5-6-7-8-9-10-11-12 |
| (1,1,0)=6 | 6-7-8-9-10-11-12-13 |
| (1,1,1)=7 | 7-8-9-10-11-12-13-14 |

Access order of non-circulatory continuous access

FIG. 13

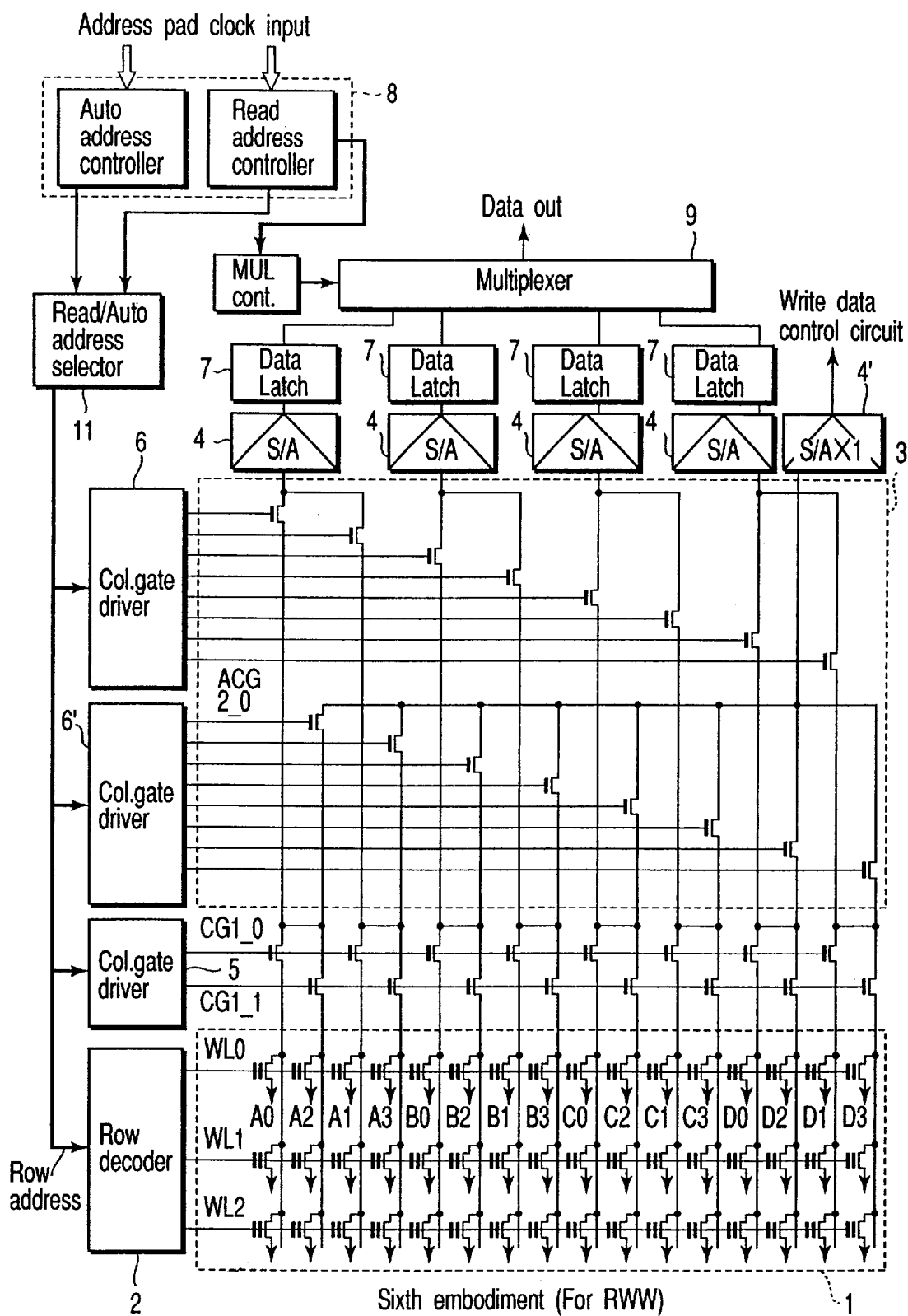
F I G. 21

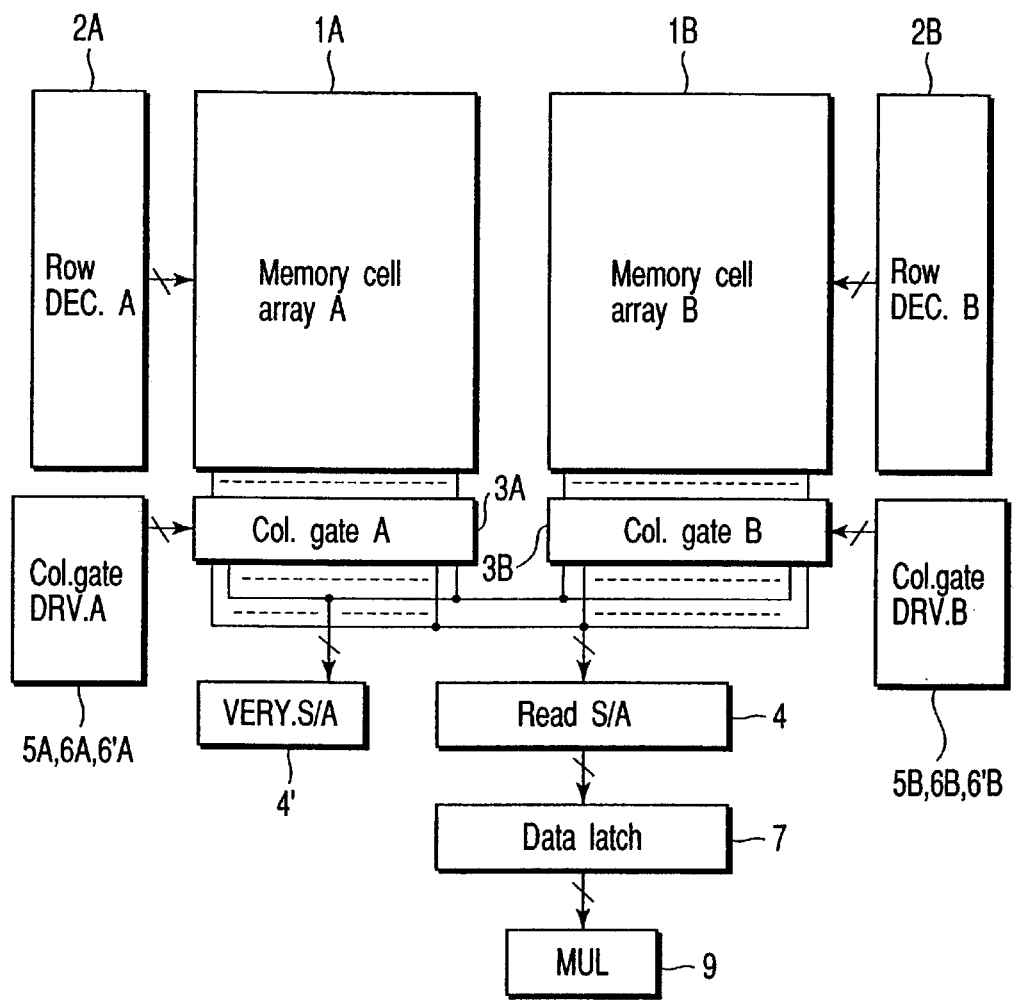
F I G. 22

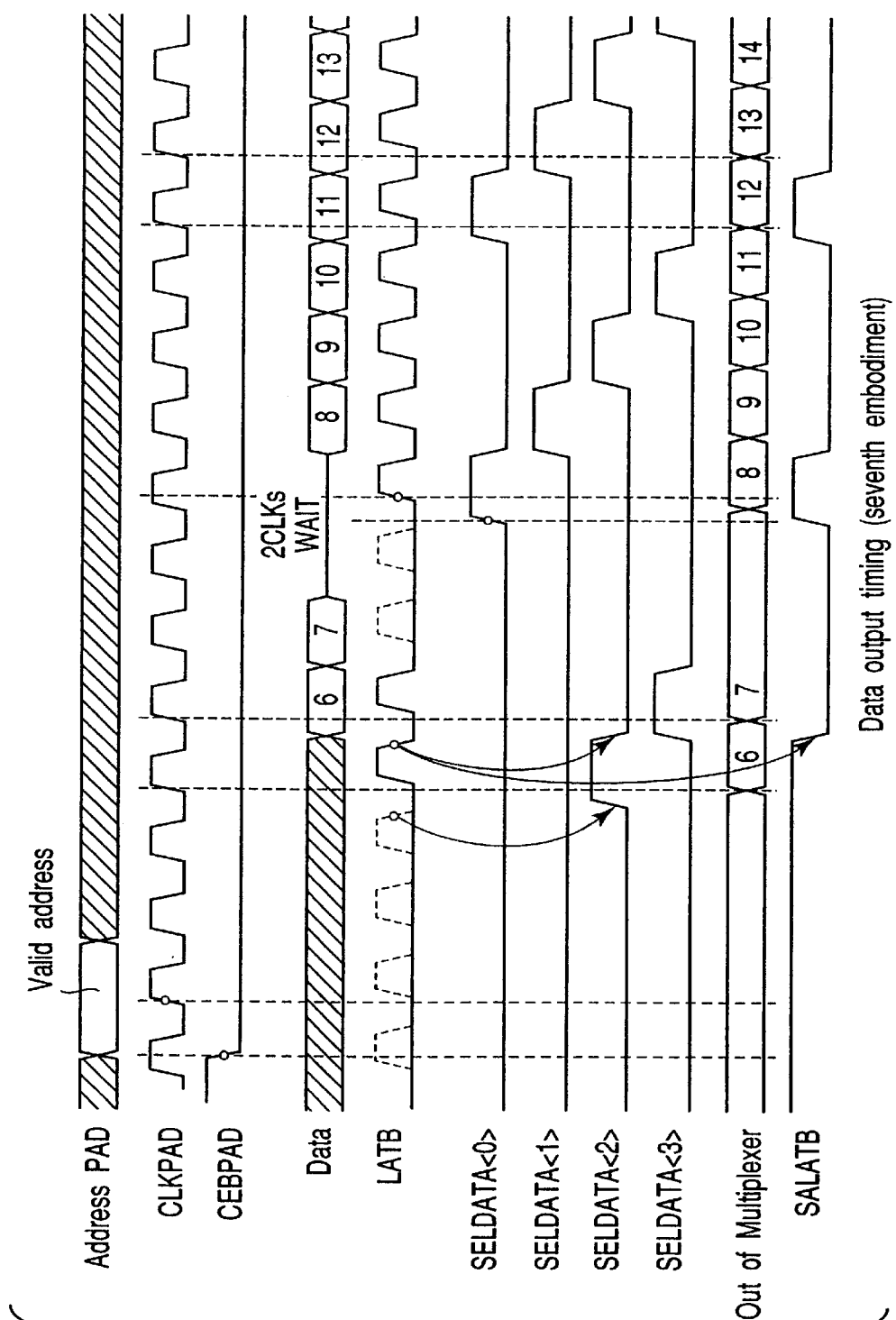
F I G. 25

SEMICONDUCTOR STORAGE APPARATUS

CROSS-REFERENCE TO RELATED APPLICATIONS

This application is a continuation of Ser. No. 10/052,303 filed Jan. 18, 2002 now U.S. Pat. No. 6,552,936.

This application is based upon and claims the benefit of priority from the prior Japanese Patent Application No. 2001-010242, filed Jan. 18, 2001, the entire contents of which are incorporated herein by reference.

BACKGROUND OF THE INVENTION

1. Field of the Invention

The present invention relates to a data reading technique of a semiconductor storage apparatus, particularly to a fast data reading technique.

2. Description of the Related Art

When a semiconductor storage apparatus (e.g., NOR type flash memory) is accessed at random, a series of reading operation including: selecting a cell for each address input; sensing cell data; and outputting the data is repeated. Therefore, a certain given time is required, and the data cannot be outputted faster.

On the other hand, a serial access operation includes: selecting cells corresponding to a plurality of addresses present on the same word line at the same time; sensing the data; latching the sensed data; and sequential outputting the latched data in synchronization with a clock from the outside. Therefore, a fast data reading is apparently realized.

Furthermore, when the latched data is sequential outputted, a next group of cells are sensed in a chip. Since a so-called "pipeline reading" is performed, an internal reading delay can be eliminated in and after a first access, and the fast data reading is enabled.

The "pipeline reading" has heretofore been realized by dividing a memory cell array into two, and disposing a decoder and sense amplifier in the two arrays, respectively. Therefore, a chip area has largely increased.

BRIEF SUMMARY OF THE INVENTION

A semiconductor device according to an aspect of the invention comprises: first to eighth bit lines; a plurality of memory cells being connected to the first to eighth bit lines; first to eighth column selection transistors, one of a source and drain of each of the first to eighth column selection transistors being connected to a corresponding one of the first to eighth bit lines; ninth to twelfth column selection transistors, one of a source and drain of the ninth column selection transistor being connected to the other of the source and drain of each of the first and second column selection transistors, one of a source and drain of the tenth column selection transistor being connected to the other of the source and drain of each of the third and fourth column selection transistors, one of a source and drain of the eleventh column selection transistor being connected to the other of the source and drain of each of the fifth and sixth column selection transistors, one of a source and drain of the twelfth column selection transistor being connected to the other of the source and drain of each of the seventh and eighth column selection transistors; first and second sense amplifiers, the first sense amplifier being connected to the other of the source and drain of each of the ninth and tenth column selection transistors, and the second sense amplifier being connected to the other of the source and drain of each of the eleventh and twelfth column selection transistors; a first column selection line being connected to gates of the first, third, fifth and seventh column selection transistors; a second column selection line being connected to gates of the second, fourth, sixth and eighth column selection transistors; and third to sixth column lines being connected to gates of the ninth to twelfth column selection transistors, respectively.

BRIEF DESCRIPTION OF THE SEVERAL VIEWS OF THE DRAWING

FIG. 1 is a circuit diagram showing one example of an NOR type flash memory according to a first embodiment of the present invention.

FIG. 2 is a diagram showing an access order of a circulatory interleave access.

FIG. 3 is a diagram showing an access order of a circulatory continuous access.

FIG. 8 is a circuit diagram showing one example of an output multiplex control circuit for a circulatory interleave access.

FIG. 9 is a circuit diagram showing one example of the output multiplex control circuit for a circulatory continuous access.

FIG. 13 is a diagram showing an access order of a non-circulatory continuous access.

FIG. 21 is a circuit diagram showing one example of the NOR type flash memory according to a sixth embodiment of the present invention.

FIG. 22 is a block diagram showing one modification example according to a sixth embodiment of the present invention.

FIG. 25 is an operation timing chart showing the data output timing according to an eighth embodiment.

DETAILED DESCRIPTION OF THE INVENTION

Figures 4, 5:
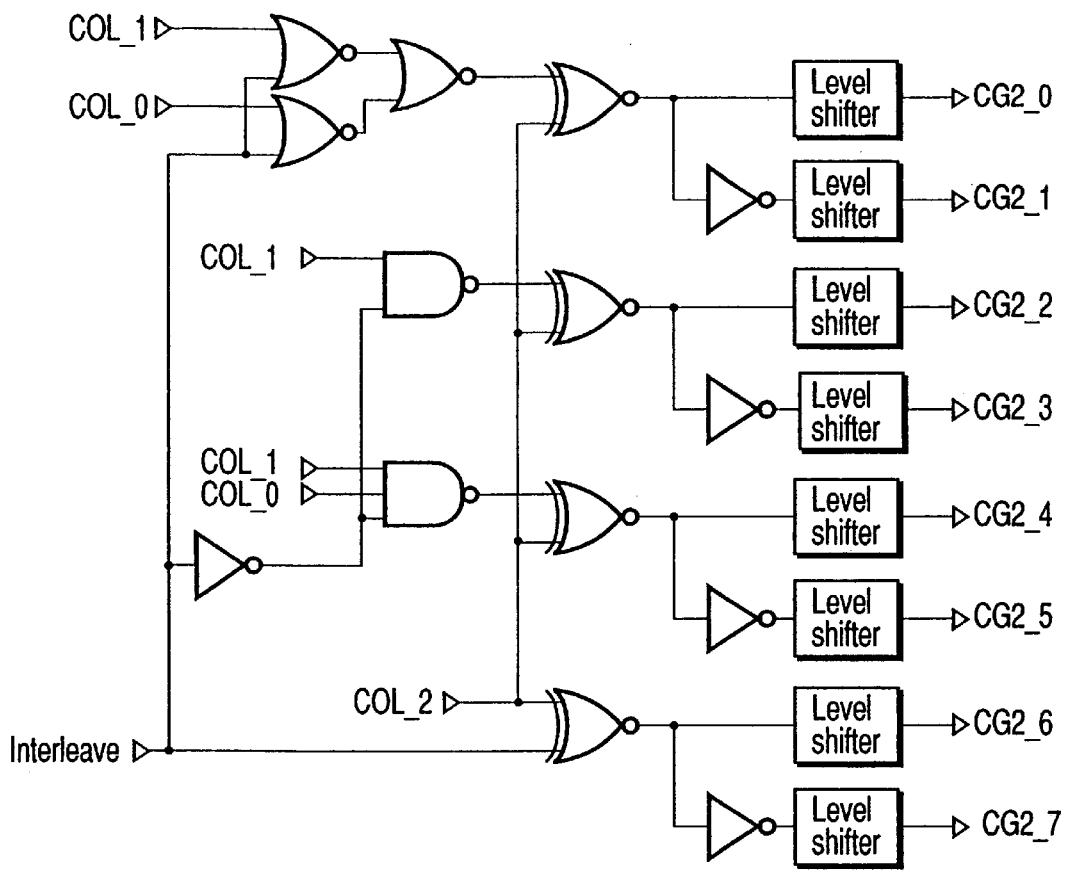
FIG. 4 is a circuit diagram showing one example of a column gate driving circuit 6.
FIG. 5 is a diagram showing a truth value when a signal INTERLEAVE is "LOW".

Embodiments of the present invention will be described hereinafter with reference to the drawings. For the description, common parts in all the drawings are denoted with common reference numerals.

First Embodiment

Constitutions of a memory cell array, column gate, and sense amplifier will first be described with reference to FIG. 1 in terms of an example of an NOR type flash memory.

FIG. 1 is a circuit diagram showing one example of the NOR type flash memory according to a first embodiment of the present invention.

As shown in FIG. 1, word lines (WL0 to WL2) of a memory cell array 1 arranged in an NOR type are selected via a row decoder 2 which receives a row address. A bit line is selected, when a tree-shaped transmission gate (column gate) 3 is opened and connected to sense amplifiers (S/A) 4.

In one example shown in FIG. 1, the column gate 3 has a tree structure of two stages, and one column gate line is selected by a column gate driving circuit (Col. Gate Driver) 5 which receives corresponding column addresses (COL_0 to COL_2) and column gate driving circuit (Col. Gate Driver) 6 which receives a column address (COL_3). In this case, a plurality of addresses of cells, for example, cells designated by four addresses are simultaneously selected, and sensed, and data is held in a data latch 7. For the latched data, an output multiplexer 9 selects the data corresponding to addresses sequential selected by an address control circuit (Address Controller) 8 and outputs the data to an output bus.

In FIG. 1, one I/O is noted. In actual, the same circuit exists for the respective I/Os.

As a major characteristic of the present embodiment, three address signals COL_0 to COL_2 are inputted into the column gate driving circuit 6, so that eight column gates CG2_0 to CG2_7 can individually and independently selected.

There are several types of an access order of the serial access, and two types of circulatory serial access of eight addresses are shown in FIGS. 2, 3.

FIG. 2 is a diagram showing the access order of a circulatory interleave access in the serial access, and FIG. 3 is a diagram showing the access order of a circulatory continuous access in the serial access.

In the interleave access shown in FIG. 2, a first combination of four addresses is only (0,1,2,3) or (4,5,6,7).

On the other hand, in the continuous access shown in FIG. 3, there are combinations for a top address, that is, eight combinations.

In one circuit example shown in FIG. 1, since eight column gates CG2_0 to CG2_7 are independently drive, four arbitrary column gates CG2 can simultaneously be opened.

One example of the column gate driving circuit 6 which realizes both the interleave access shown in FIG. 2 and the continuous access shown in FIG. 3 is shown in FIG. 4.

As shown in FIG. 4, when a signal INTERLEAVE is "HIGH", the selected column is determined only by COL_2. When COL_2="LOW", the column gates CG2_0, CG2_2, CG2_4, CG2_6 are selected. When COL_2="HIGH", the column gates CG2_1, CG2_3, CG2_5, CG2_7 are selected. In these cases, the memory cells corresponding to the addresses (0,1,2,3) and (4,5,6,7) are accessed.

Moreover, a truth value table of a time when the signal INTERLEAVE is "LOW" is shown in FIG. 5.

An interleave access operation will next be described in more detail.

Figure 6:
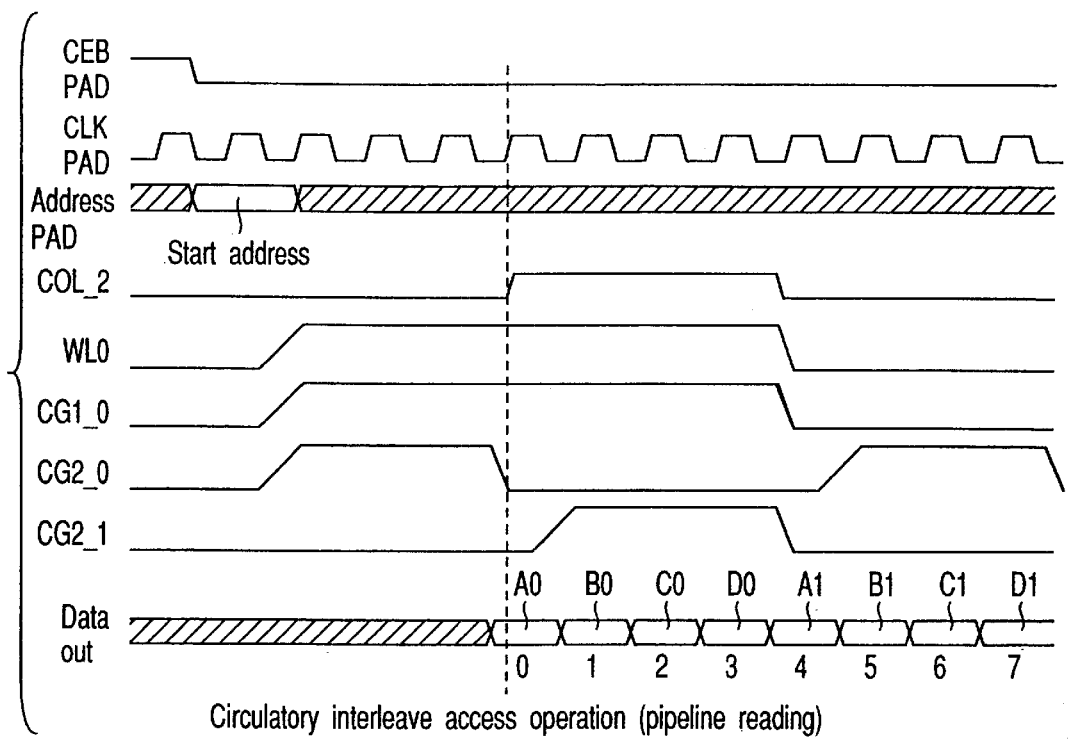
FIG. 6 is an operation timing chart showing a circulatory interleave access operation (pipeline reading).

FIG. 6 is an operation timing chart showing an interleave pipeline reading operation.

As shown in FIG. 6, when the latched data for four addresses (A0, B0, C0, D0 in this example) are sequential outputted, the cells for the next four addresses are selected and sensed (pipeline-operated), and therefore an internal delay of a sensing time cannot be seen outside a chip.

Read data (Dataout) is sequential outputted in a predetermined address order in synchronization with a clock signal inputted via CLKPAD.

First, a reading start address inputted into an address pad is latched at a first rising of CLK, after a chip enable signal/CE="LOW". A bias is applied to the word line (WL0) and column gates (CG1_0 to CG2_0) in accordance with the latched address, and sensing is started with respect to respective bit lines of A0, B0, C0, D0. When the data for four addresses is latched in the data latch 7 shown in FIG. 1, data output is started.

In the present example, simultaneously with the start of the data output, COL_2 is reversed, the selected column gate is switched to CG2_1, and respective bit lines of A1, B1, C1, D1 are sensed. The sensing is ended, and latched data is updated, before D0 is outputted as the read data. Then, data of A1 can be outputted continuously after the data of D0.

Figure 7:
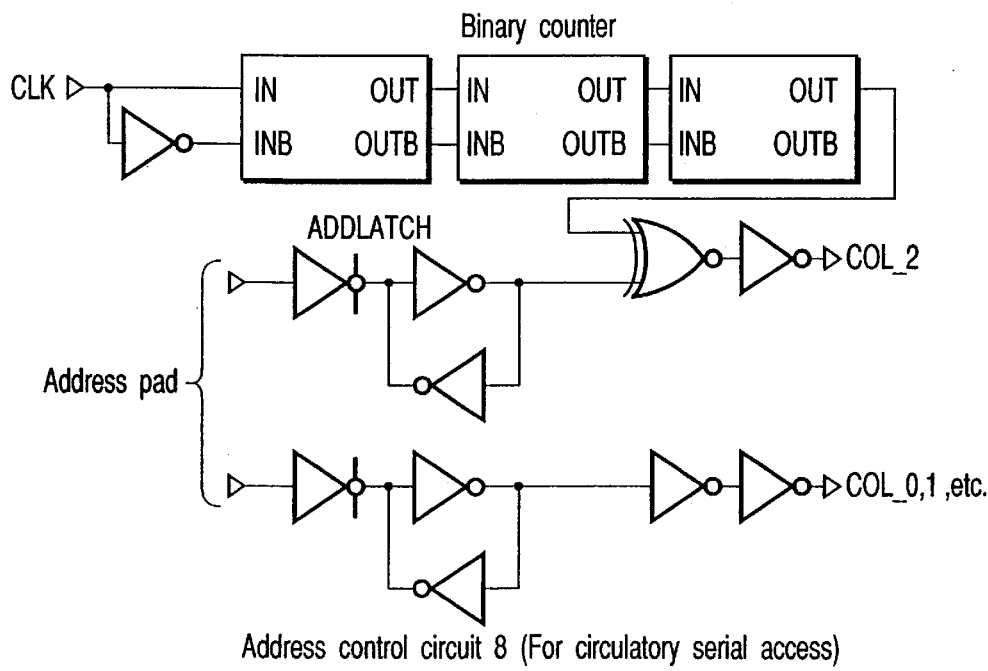
FIG. 7 is a circuit diagram showing one example of an address control circuit with respect to a circulatory serial access.

One example of the address control circuit 8 for realizing this operation is shown in FIG. 7, and one example of an output multiplex control circuit is shown in FIG. 8.

In the address control circuit 8 shown in FIG. 7, and the output multiplex control circuit shown in FIG. 8, the address is first latched, and only COL_2 is reversed after four clocks. This can realize the operation shown in FIG. 6.

Moreover, in FIGS. 6 to 8, a simple case of 1 clock 1 data out is assumed. With a relation between a clock frequency and the internal sensing time, for example, in 2 clocks 1 data out, after eight clocks are counted, COL_2 may be reversed.

Second Embodiment

In the first embodiment, the circulatory interleave access has mainly been described. In a second embodiment, an example of circulatory continuous access is shown.

The continuous access shown in FIG. 3 is realized by modifying the output multiplex control circuit of the constitution shown in FIG. 1 as shown in FIG. 9.

Figures 10, 11:
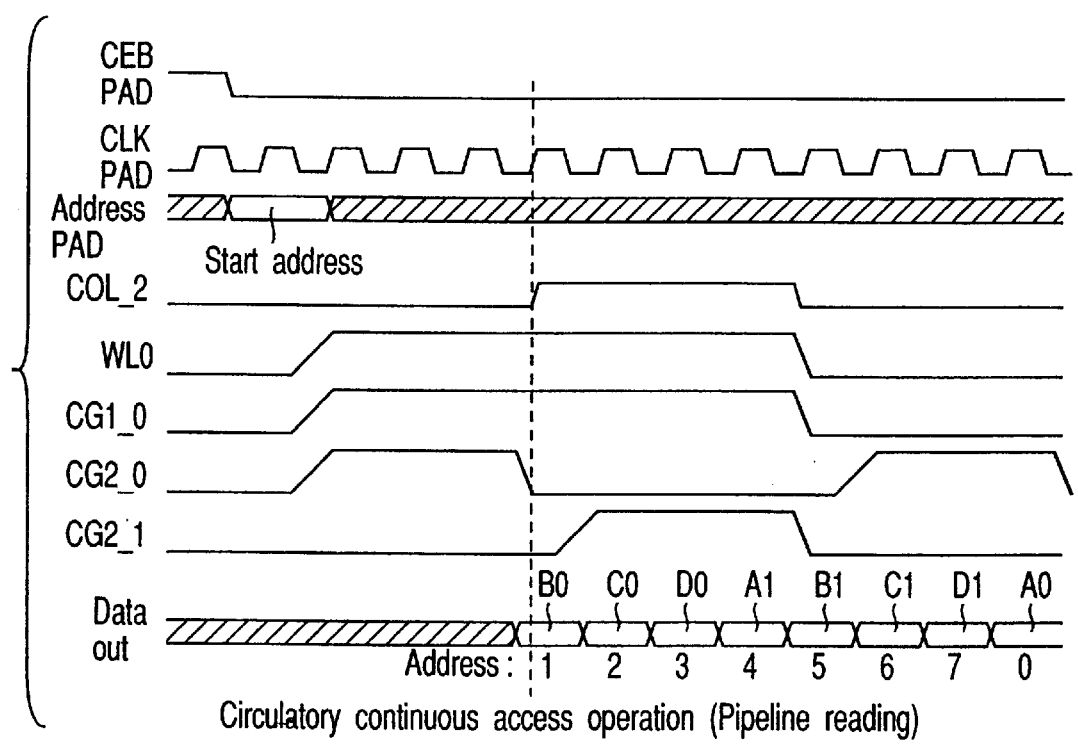
FIG. 10 is a diagram showing a combination simultaneously selected by the circulatory continuous access.
FIG. 11 is an operation timing chart showing a circulatory continuous access operation (pipeline reading).

A characteristic of the circulatory continuous access lies in that the combination of simultaneously selected cells changes with a start address. Concretely, it is necessary to simultaneously select the cells as shown in FIG. 10. When the constitution of the column gate 3 shown in FIG. 1 is used, and the signal of the column gate driving circuit 6 shown in FIG. 4 is set to INTERLEAVE="LOW", the combination shown in FIG. 10 can be obtained.

In the cell constitution shown in FIG. 1, four bit lines are allotted to one sense amplifier. To select one bit line in accordance with the address signal, the address signal of two bits is essentially sufficient.

However, COL__1, COL__0 used in the multiplexer of a sense amplifier output are also inputted to the column gate driving circuit 6 of CG2, and a column gate signal of CG2 is all divided for every four sense amplifiers.

In this case, the cells for four arbitrarily continuous addresses can be selected from the cells for eight addresses (COL__2,COL__1,COL__0)=(0,0,0) to (1,1,1). In the column gate driving circuit 6 for driving CG2 shown in FIG. 4, when the signal INTERLEAVE="LOW", the simultaneous selection shown in FIG. 10 is enabled in accordance with the start address.

When the start address is (0,0,0)=0, the cells of addresses 0 to 3 are obediently selected. Moreover, for example, with the start address (0,0,0)=1, CG2__1,2,4,6 (not CG2__0 but CG2__1) are opened, and thereby four address cells for continuous addresses 1 to 4 can be selected. After the cell data for four addresses is latched in the data latch (data latch 7 shown in FIG. 1), COL__2 is reversed. Then, CG2__0,3,5,7 are selected and cells of addresses 0,5,6,7 are read.

After the cells for four addresses are sensed, COL__2 is reversed, and thereby the remaining cells for four addresses are simultaneously selected.

A timing of the circulatory continuous access operation (pipeline reading) using the aforementioned constitution is shown in FIG. 11. A control method of the address is the same as that of the first embodiment, and the address control circuit 8 shown in FIG. 7 may be used.

In FIG. 11, the column gate CG2__0 is selected again. After D1 is outputted, the data returns to A0, and is circulated and outputted. It is possible to easily perform a control for outputting the cells for eight addresses only once and stopping data output (Data Out).

Additionally, the access of the first embodiment is different from the access of the second embodiment only in the output multiplex control. Therefore, when the output of the output multiplex control circuit is switched, either access can be realized on the same chip. To change an output order, a fuse for use in R/D replacement or a command inputted from the outside of the chip may be used.

Furthermore, when a logic of the output multiplex control circuit shown in FIG. 9 is combined with a logic of the output multiplex control circuit shown in FIG. 8, the circulatory continuous access shown in FIG. 3 and the circulatory interleave access shown in FIG. 2 can be realized on the same chip. Concretely, for example, an exclusive NOR 21 in FIG. 8 is connected in parallel to an adder 22 in FIG. 9, the signal INTERLEAVE for switching the interleave access and continuous access is used, and either one of the exclusive NOR 21 and the adder 22 may be set to be active.

Moreover, both in the first and second embodiments, the pipeline operation for sequential sensing the cells for four addresses has been described as an example. For example, when eight addresses are simultaneously sensed, the serial access of 16 addresses can be realized.

Third Embodiment

The first and second embodiments show the example relating to the circulatory serial access. A third embodiment shows an example relating to a non-circulatory serial access, for example, a serial access in which the addresses sequential increase.

Figure 12:
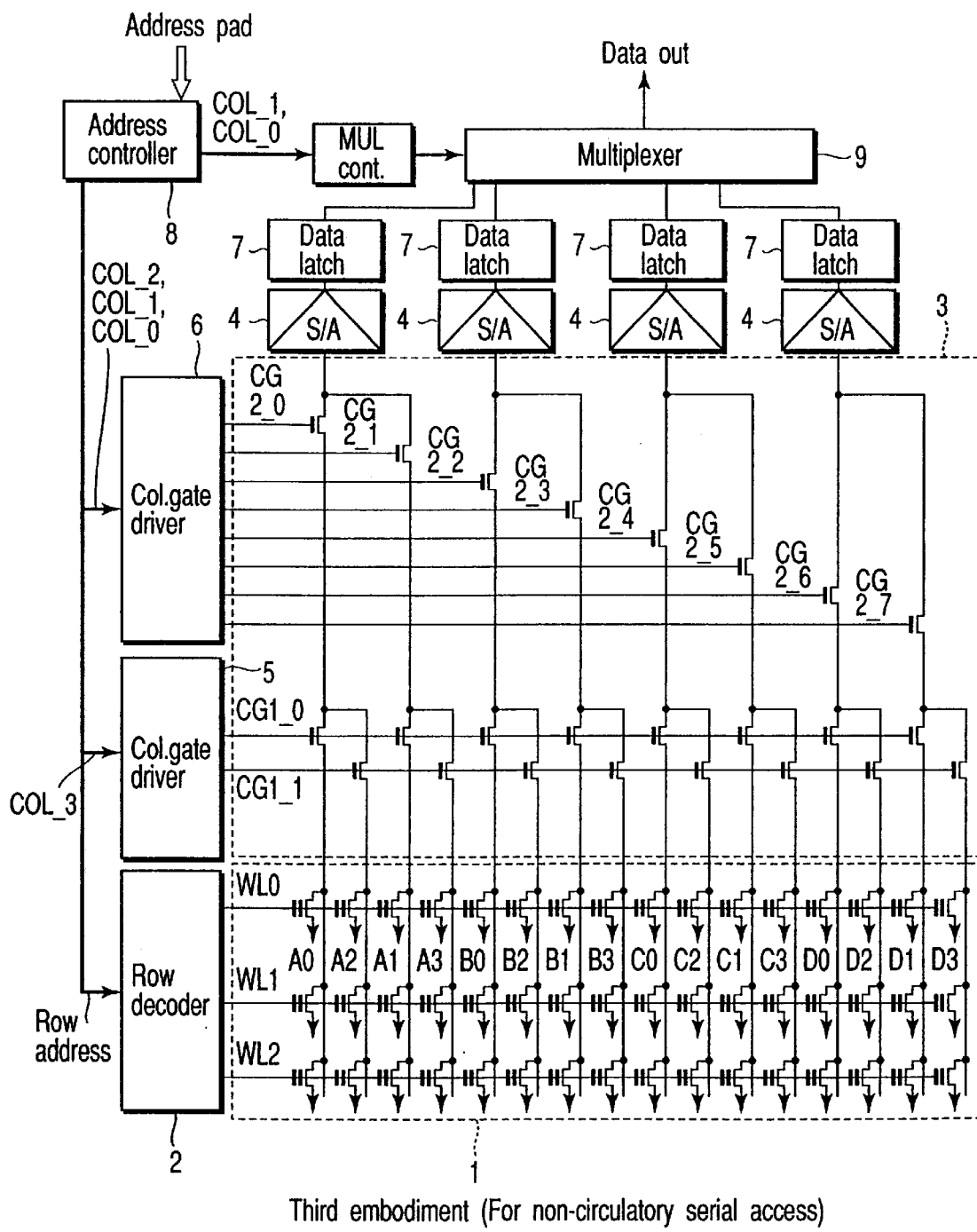
FIG. 12 is a circuit diagram showing one example of the NOR type flash memory according to a third embodiment of the present invention.

One example of an NOR type flash memory according to the third embodiment of the present invention is shown in FIG. 12, and the access order of a non-circulatory continuous access is shown in FIG. 13.

Figure 14A:
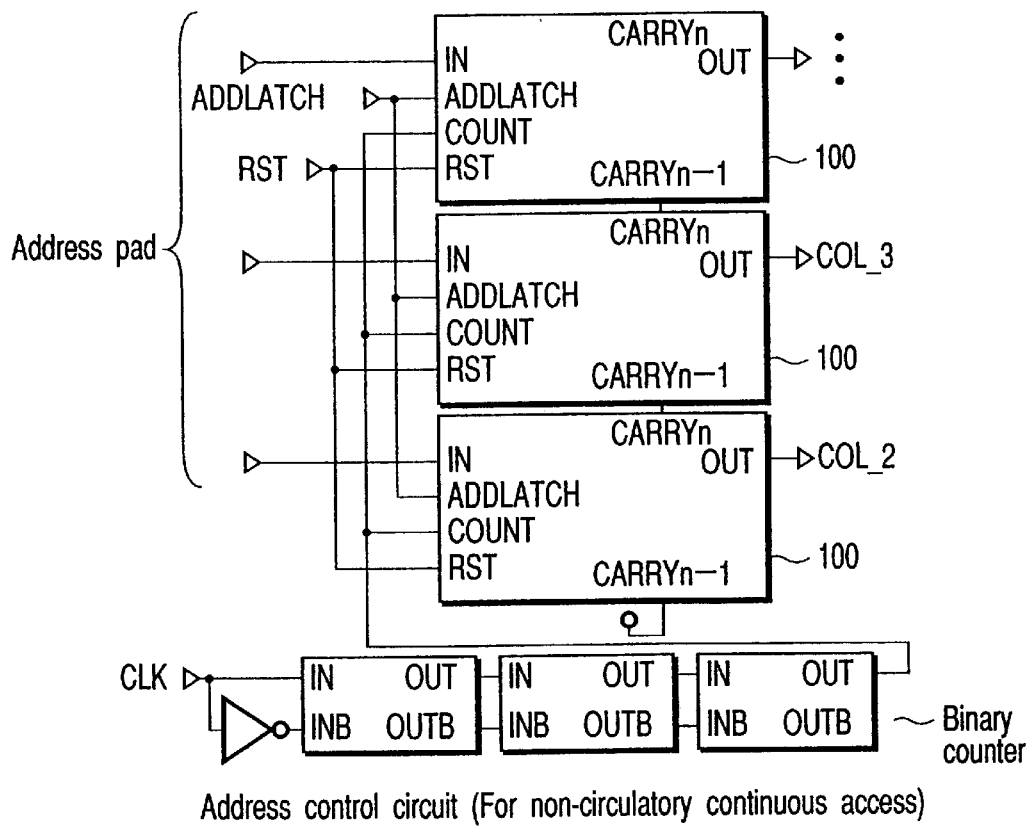
FIG. 14A is a diagram showing one example of the address control circuit with respect to a non-circulatory serial access.
Figure 14B:
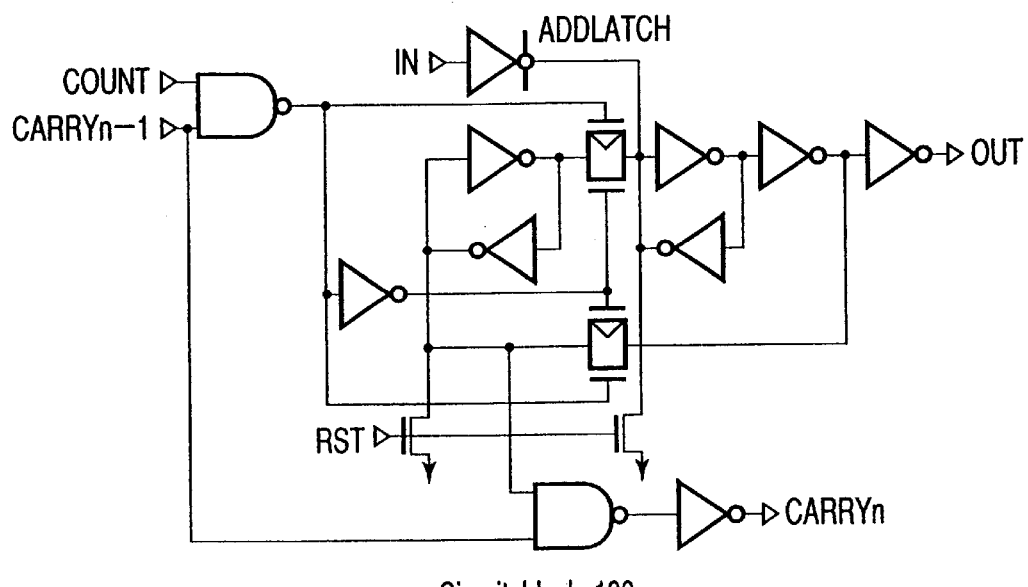
FIG. 14B is a circuit diagram showing one circuit example of a circuit block 100 shown in FIG. 14A.

With the non-circulatory continuous access, it is necessary to count up the address. One example of the address control circuit 8 which can count-up the address is shown in FIG. 14A. Moreover, FIG. 14B shows one circuit example of a circuit block 100 shown in FIG. 14A.

The address control circuit 8 shown in FIG. 14A sequential counts up high-level addresses every four clocks from COL__2.

Figure 15:
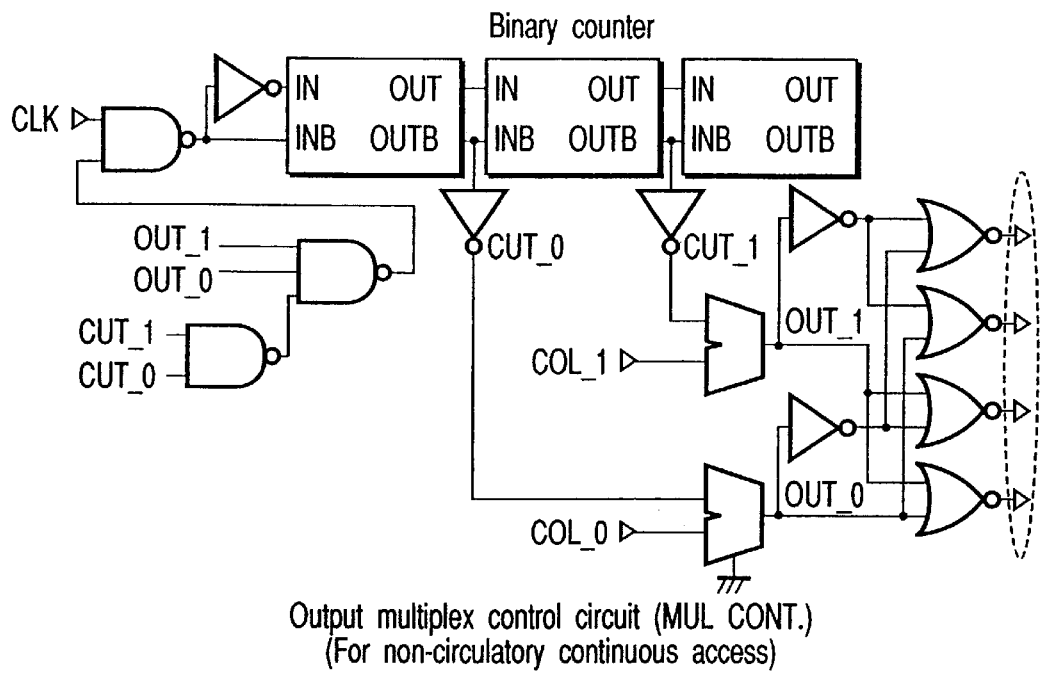
FIG. 15 is a circuit diagram showing one example of an output multiplex control circuit for the non-circulatory continuous access.

On the other hand, as shown in FIG. 15, for an output multiplex control circuit in which COL__0, COL__1 are used to sequential serially output predetermined data from the data latch 7 in synchronization with the clock, a circuit substantially equal to the output multiplex control circuit shown in FIG. 9 can be used.

However, with a start address other than (COL__2,COL__1,COL__0)=(0,0,0), (1,0,0), the output of the pipeline reading is not in time with four clocks in some case. For example, assume that the start address is (1,0,1), that is, address 5. In the first sensing after the start of reading, the cells of addresses 5,6,7,0 (B1,C1,D1,A0) are selected and simultaneously sensed. While the data are outputted, the cells for the next four addresses are sensed. Although the data for four addresses 5,6,7,8 (B1,C1,D1,A2) originally have to be outputted, the cell of address 8 (A2) is not selected. To select this cell, the gate of CG1 has to be switched.

Therefore, after the cell data of address 7 is outputted, it is necessary to stop the count up in the output multiplex control circuit shown in FIG. 15. Therefore, in the output multiplex control circuit of FIG. 15, when address (OUT__1,OUT__0) of output data selection turns to (1,1) before counting four clocks, the count-up is controlled and discontinued.

Figure 16:
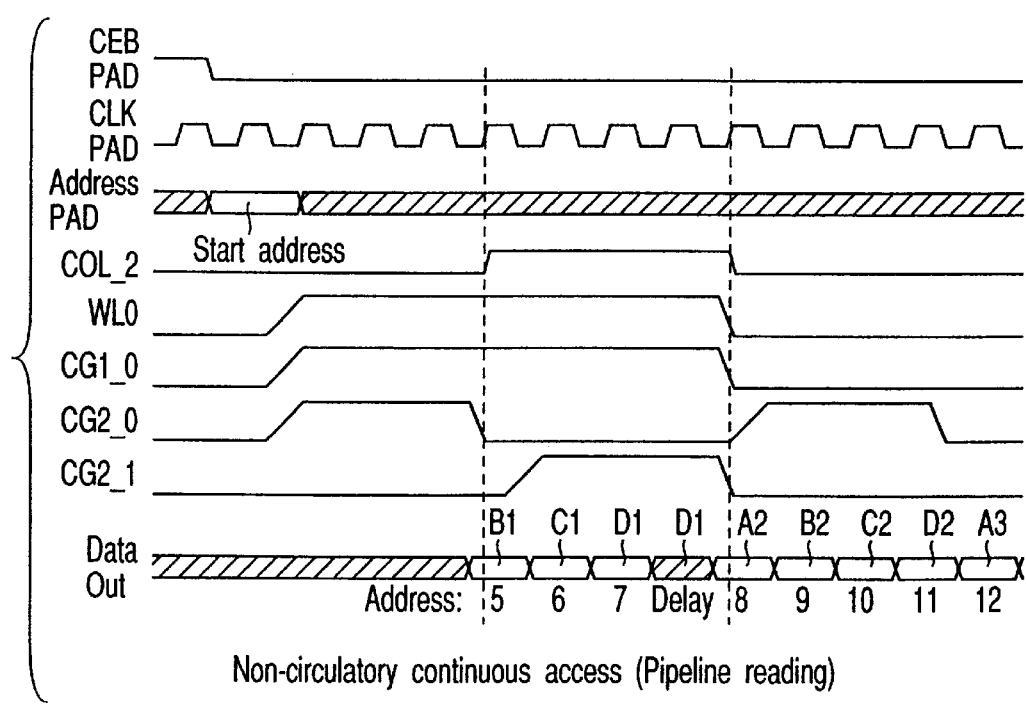
FIG. 16 is an operation timing chart showing a non-circulatory continuous access operation (pipeline reading).

FIG. 16 is an operation timing chart showing a non-circulatory continuous access operation (pipeline reading).

As shown in FIG. 16, with the non-circulatory continuous access, while first eight addresses are read, with a low-level start address other than 0, three clocks at maximum are waited for. Thereafter, the address can continuously be read without delay until the row address is switched.

Of course, when the column gate CG1 is independently controlled like CG2, the continuous serial access can be realized without delay with respect to changing of the column. However, the same number of column gates as the number of bit lines exist in CG1, and an area penalty is large in independently controlling the respective column gates. It is preferable to perform the independent control of the column gates in the high-level of a tree.

Fourth Embodiment

A fourth embodiment is an example in which a redundancy technique is applied to the present invention.

In a semiconductor storage apparatus, when defective memory cells generated by a processing defect are replaced with spare columns (bit lines), a product defect is prevented. A redundancy system will be described which includes: also reading the cell data of the spare columns at the same time during reading; judging whether the column to be replaced is included in the accessed address; and changing the sense amplifier output.

Figure 17:
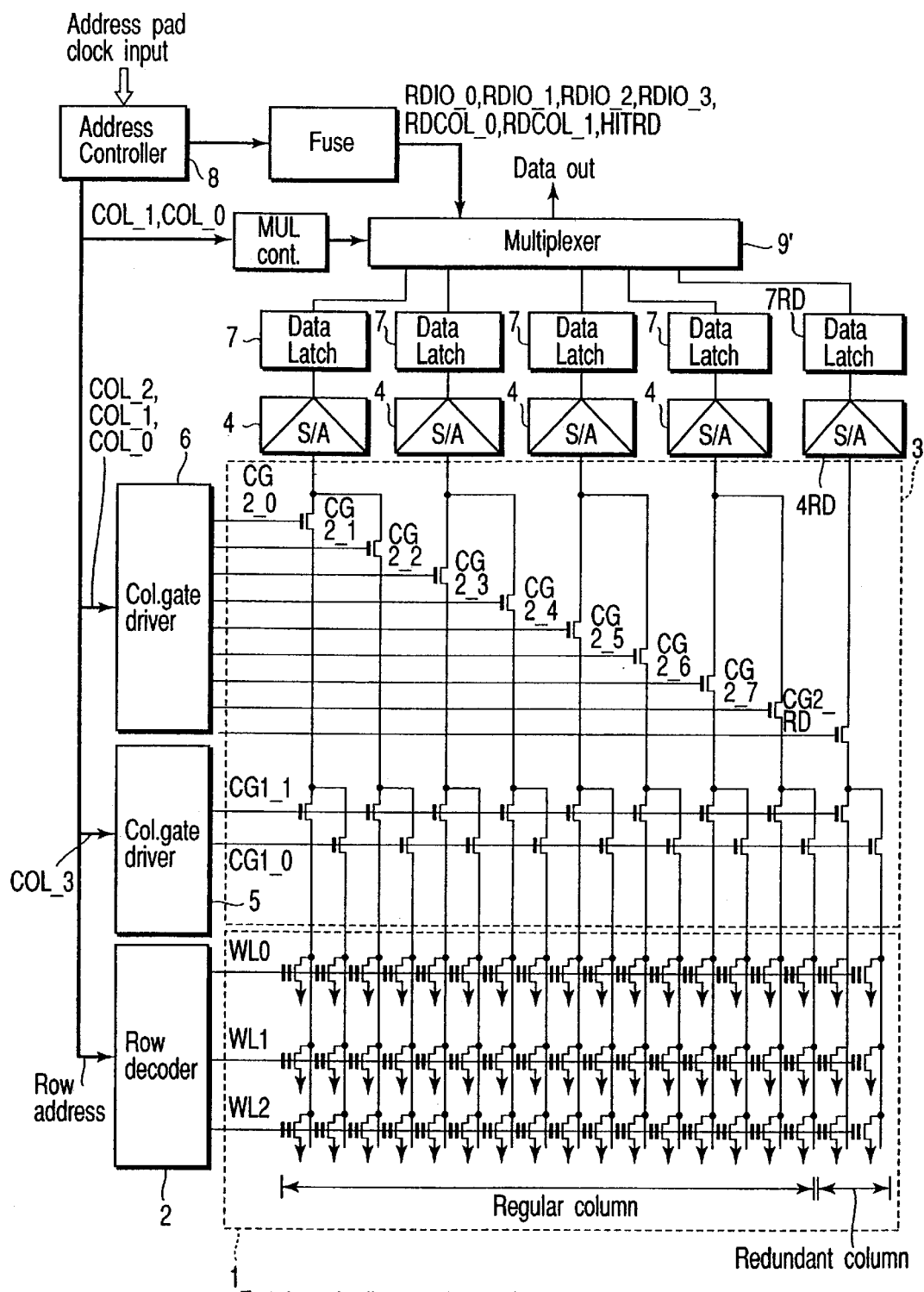
FIG. 17 is a circuit diagram showing one example of the NOR type flash memory according to a fourth embodiment of the present invention.

FIG. 17 is a circuit diagram showing one example of the NOR type flash memory according to the fourth embodiment of the present invention, and shows a constitution in which the serial access is realized with respect to the memory cell array including redundant columns (spare columns).

As shown in FIG. 17, in the fourth embodiment, in addition to the constitution of FIG. 1, S/A 4RD for the redundant columns, and data latch 7RD for the redundant columns are disposed, and redundant cells (spare cells) are sensed together with main cells during sensing. Moreover, at a time of data output, the input address is compared with Fuse data for defective address information. At a time of hit (agreement), the data sensed by the S/A 4RD for the redundant columns and latched by the data latch 7RD for the redundant columns replaces the data corresponding to a defective address in the data latch 7 by an output multiplexer 9', and instead the data latch 7RD for the redundant columns is selected. In the present description, the output multiplexer 9' is referred to as a multiplexer with a replacement function. The redundant column is accessed every address, the sense amplifier output is multiplexed at a data output stage, and thereby a time for judging spare replacement can apparently be eliminated.

The column gate of the redundant column is controlled with the same signal as the signal of a main body of the apparatus, or is constantly opened. In FIG. 17, the same signal as that of the main body is used in CG1 on a cell side, and CG2_RD is constantly controlled to be "HIGH".

Replacement with redundant column data in the multiplex at the data output time will be described with reference to FIG. 18.

Upon receiving an input of internal addresses (high-level addresses from COL_2, COL_3), Fuse data is determined. In FIGS. 17, 18, signal HITRD is a signal for judging whether replacement is necessary, RDCOL_0, RDCOL_1 are low-level addresses of replacement, and RDIO_0, RDIO_1, RDIO_2, RDIO_3 denote I/O of replacement. In this case, a data width is 16I/O.

Figure 18:
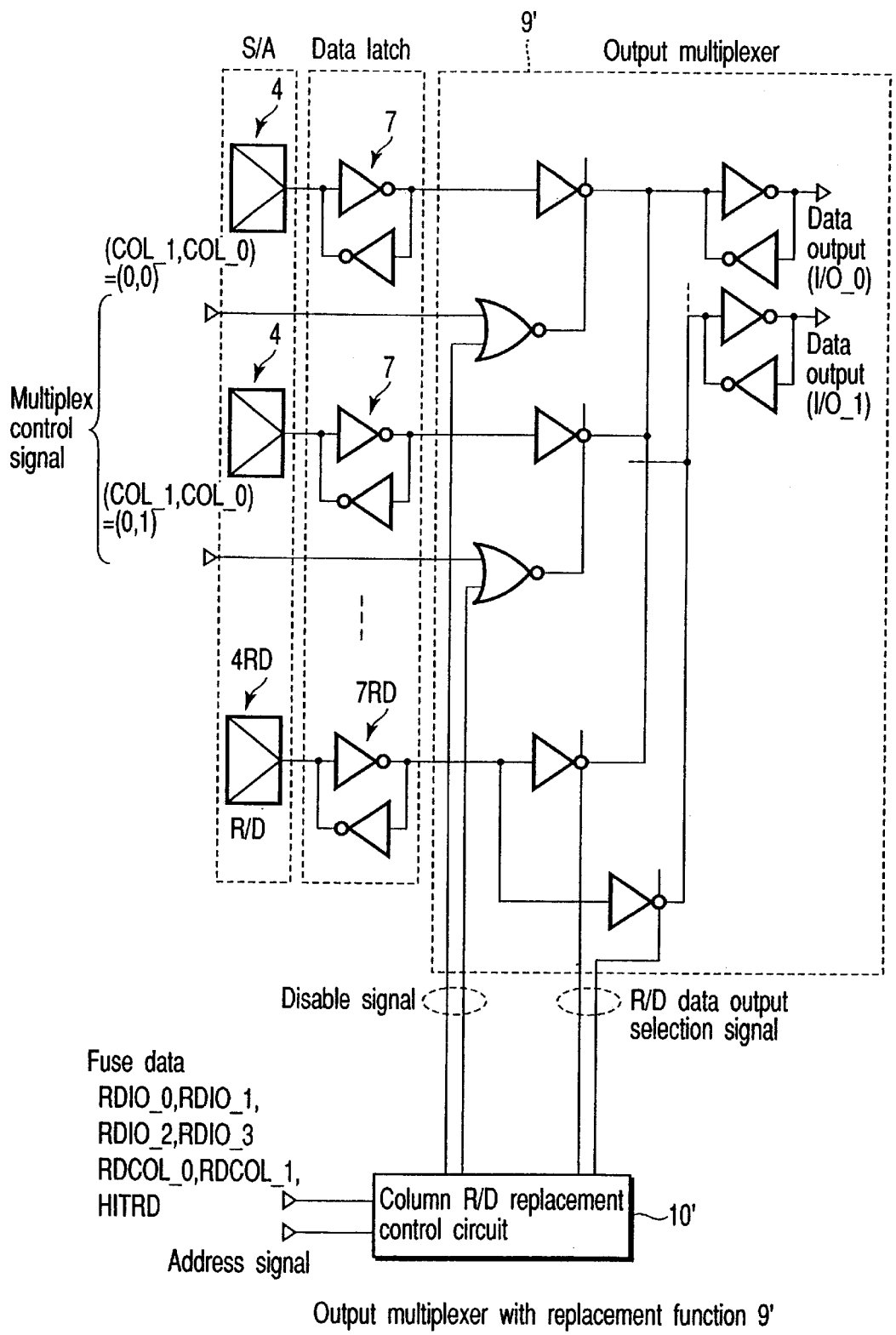
FIG. 18 is a circuit diagram showing one example of an output multiplexer having a replacement function.

When four address cells are selected by the internal addresses and sensed, Fuse data is simultaneously read, and latched by a column R/D replacement control circuit 10 of FIG. 18. At this time, since the address and I/O requiring the replacement are determined, defective data output is disabled before the data output. When the replacement address is hit with the serial access, a transmission gate is opened and R/D data is outputted.

Reading of the Fuse data may be ended during simultaneous sensing of the four address cells.

In general, since the sensing time of the memory cell is longer, a reading time of Fuse does not influence the access.

Fifth Embodiment

A fifth embodiment shows a second example in which the redundancy technique is applied to the present invention.

Figure 19:
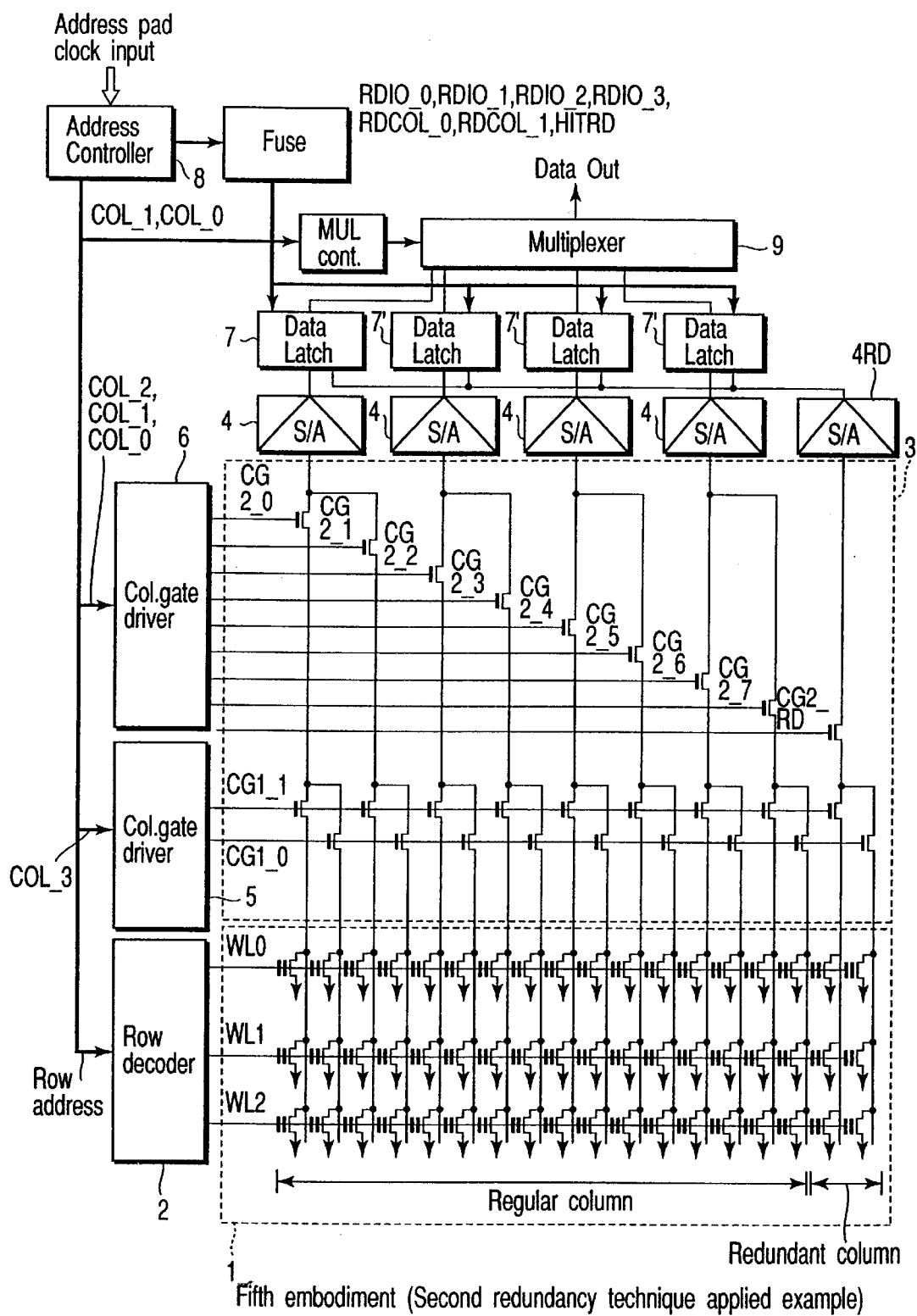
FIG. 19 is a circuit diagram showing one example of the NOR type flash memory according to a fifth embodiment of the present invention.

FIG. 19 is a circuit diagram showing one example of the NOR type flash memory according to the fifth embodiment of the present invention.

In the fourth embodiment, the sense amplifier 4RD connected to the redundant column also has the data latch 7RD, and performs the data replacement in the multiplex of the data output time.

However, the data can also be replaced with the redundant cell data, when the data is held in the data latch 7. The constitution is shown in FIG. 19.

The output of the sense amplifier 4RD connected to the redundant column is connected to all data latches 7', and the data latch 7' replaces the output of the sense amplifier 4 of the column corresponding to the defective column address designated by Fuse, and latches the data. In the present description, the data latch 7' is called a data latch with a replacement function. A concrete constitution of the data latch with the replacement function 7' and output multiplexer 9 is shown in FIG. 20.

Figure 20:
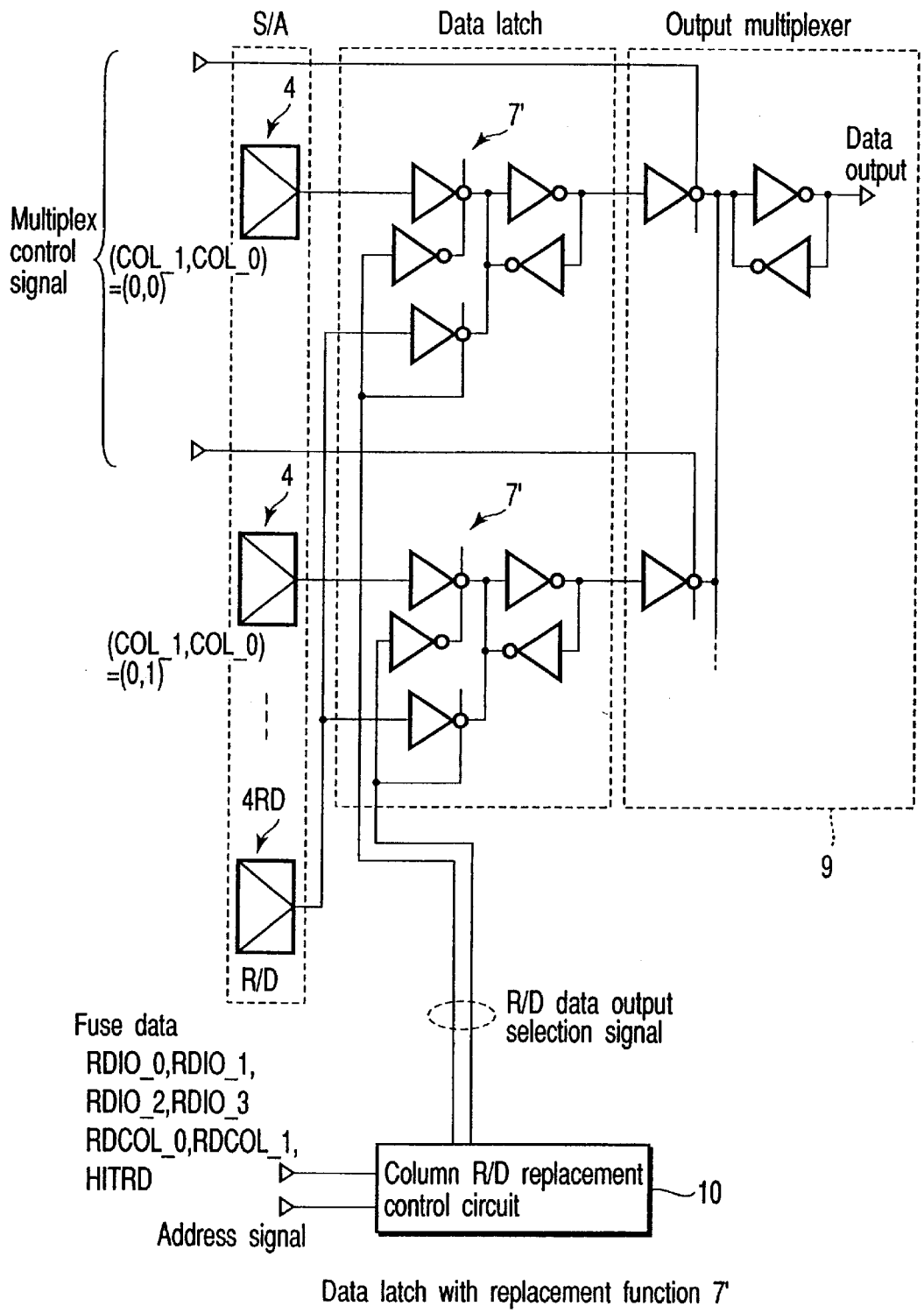
FIG. 20 is a circuit diagram showing one example of a data latch having a replacement function.

In an example shown in FIG. 20, the defective cell data is already replaced with the redundant cell data, when the sensing and data latching end. Therefore, as compared with the example shown in FIG. 18 of the fourth embodiment, there can be obtained an advantage that it is unnecessary to latch the Fuse data (defective address, I/O data) in the column R/D replacement control circuit 10.

Sixth Embodiment

A sixth embodiment shows an example in which the present invention is applied to a technique for performing data reading and data writing or data erasing in a dual manner.

FIG. 21 is a circuit diagram showing one example of the NOR type flash memory according to the sixth embodiment of the present invention.

In the flash memory, the writing of the data into the cell, erasing, and verifying operation can automatically be controlled in the chip in some case. The writing requires a time of several microseconds, and erasing requires a time of several hundreds of milliseconds to several seconds, and the chip executing an automatic operation is usually in a busy state, and cannot be read or accessed. A read while write function (RWW function) for enabling the reading out to the cell other than the cell of the writing/erasing block even during execution of the automatic operation is disposed can be realized by arranging two column gates CG2 in parallel as shown in FIG. 21.

An RCG gate is a switch for connecting the bit line with the sense amplifier for reading, and has the same function as that of the first embodiment. Gate ACG2 connected to the bit line in parallel to RCG2 serves as a switch for connection to the sense amplifier for performing writing/erasing verification during automatic operation.

IN FIG. 21, a plurality of sets of the memory cell array 1, row decoder 2, column gate 3, column gate driving circuits 5, 6, 6' are disposed in the chip. The RWW function cannot be disposed among the cells by which the sets are shared. The RWW function can be realized only among the cells (banks) by which the word line, bit line, and driver circuit are not shared. However, the address control circuit 8, sense amplifier 4, data latch 7, and output multiplexer 9 shown in FIG. 21 can be shared and used.

For the RWW function, two sets of the address control circuit 8 and sense amplifier 4 are disposed for Auto and Read. The address control circuit for Read controls the address and clock for the reading.

On the other hand, in the address control circuit for Auto, the address written from the outside of the chip, or deleted/designated by a command is latched until the automatic operation ends.

For the addresses to be inputted to the row decoder 2, column gate driving circuits 5, 6, 6', it is judged whether the memory cell array 1 as an object is during Auto or Read, and the corresponding address is designated by an address selector 11, and inputted. For the column gate driving circuits 6, 6', with the address for Auto, only the column gate driving circuit 6' is activated for connection to a sense amplifier 4' for Auto, and the column gates of RCG2 are all closed. This is totally reverse to the operation of a Read time.

In the present embodiment, the sense amplifier is divided into the sense amplifier 4 for Read and sense amplifier 4' for Auto. Thereby, the sense amplifier 4 for Read is disposed for "4×data width", and the sense amplifier 4' for Auto is disposed for "1×data width".

If the sense amplifier 4 is shared for the reading and verifying and the RWW function is to be realized, the sense amplifiers for 4×16=64+R/D with four addresses and data width of 16 are required every unit (bank) of RWW. For example, in a two-banks constitution, 128 sense amplifiers are necessary.

On the other hand, when the function of the sense amplifier 4 is divided for the reading and verifying, the number of sense amplifiers for the verifying can be reduced, for example, to 16 amplifiers for one word. In this example, there are provided the reading sense amplifier 4 and the verifying sense amplifier 4'.

Moreover, when a writing load transistor for writing a hot electron is connected only to the verifying sense amplifier 4', a load capacity of the bit line for the reading can be reduced, and the sensing time can effectively be reduced.

Furthermore, the reading sense amplifier 4 and verifying sense amplifier 4' can also be shared by at least two memory cell arrays which do not share the decoder. A concrete example is shown in FIG. 22.

As shown in FIG. 22, the reading sense amplifier (READ S/A) 4 is shared by a memory cell array (MEMORY CELL ARRAY A) 1A and memory cell array (MEMORY CELL ARRAY B) 1B, and the verifying sense amplifier (VERY. S/A) 4' is similarly shared by the memory cell array 1A and memory cell array 1B.

The row of the memory cell array 1A is selected by a row decoder (Row DEC. A) 2A, and the row of the memory cell array 1B is selected by a row decoder (Row DEC. B) 2B. Similarly, the column of the memory cell array 1A is selected by a column gate (Col. GATE A) 3A, and column gate driving circuits (Col. GATE DRV. A) 5A, 6A, 6'A, and the column of the memory cell array 1B is selected by a column gate (Col. GATE B) 3B, and column gate driving circuits (Col. GATE DRV. B) SB, 6B, 6'B. The memory cell arrays 1A and 1B do not share the decoder in this manner.

In an example of FIG. 22, since the reading sense amplifier 4 and verifying sense amplifier 4' are shared by the memory cell arrays 1A and 1B, the chip area can be inhibited from increasing.

Seventh Embodiment

In a synchronous reading operation, the data has to be outputted in synchronization with an external clock. During the reading operation, timings of the word line to the selected memory cell, bit line bias, sense amplifier enable, sense output latch, and the like are necessary, and these timings can also be prepared from an external clock.

However, an external clock frequency fluctuates with a system in which the chip is mounted, and is not constant. An upper limit of the frequency is determined by a value which can continuously be outputted without delay in a pipeline operation. For a lower limit, a frequency range has to be expanded without any principle. During reading of a slow period, when the timing is prepared by the external clock, undesirable problems such as a wastefully long-time biased cell are generated in reliability.

To solve the problem, only the timings of the latch of the sense amplifier output, output of the latched data, and access start to the next address are synchronized with the external clock. For internal timings of equalizing and precharging of a sense line and reference line, sense amplifier enable, and the like, it is considered to generate the timings with an internal delay as in a conventional art. Then, the bias onto the cell and the sense timing do not depend on the frequency of the external clock, and further matching with a conventional a synchronous operation is facilitated.

Figure 23:
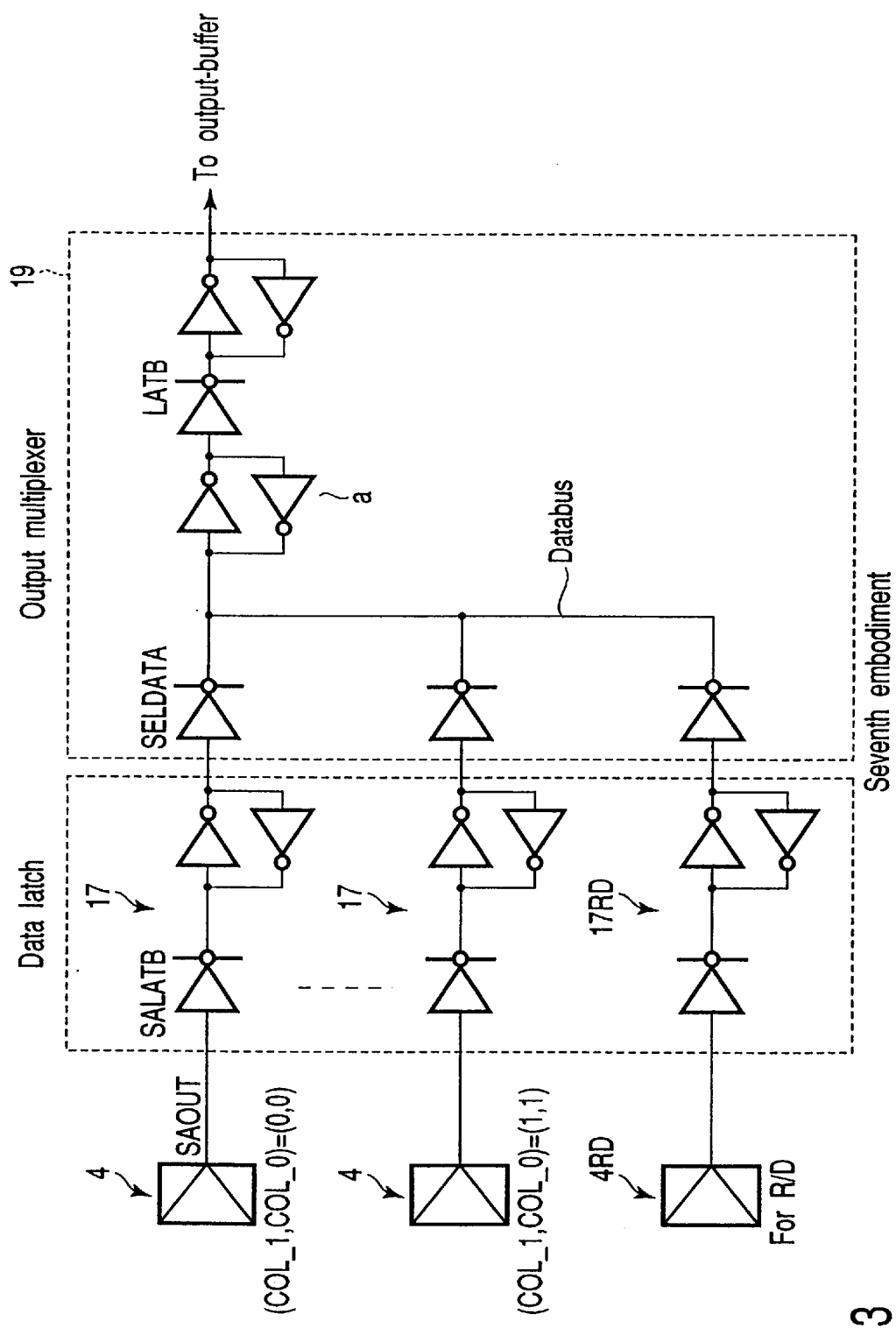
FIG. 23 is a circuit diagram showing one example of a data reading system circuit of the NOR type flash memory according to a seventh embodiment of the present invention.

An inverter array circuit for opening/closing a path extending through the sense amplifier 4, data latch 7, output multiplexer 9, and data output according to a seventh embodiment of the present invention is shown in FIG. 23.

As shown in FIG. 23, an output SAOUT of the sense amplifier 4 is transferred to and latched by a data latch 17, when a signal SALATB is "HIGH". For the latched data, low-level column addresses (COL_0, COL_1) are received at a timing of SELDATA="HIGH", one piece of data is selected from a plurality of pieces of data, outputted to DATABUS, and latched by a latch a (function of an output multiplexer 19).

With the synchronous serial access, the next coming data is known. Therefore, while the data is outputted to the outside of the chip, the next data is brought to the latch a. A signal LATB is raised at a timing CLKPAD and immediately new data can be outputted.

Figure 24:
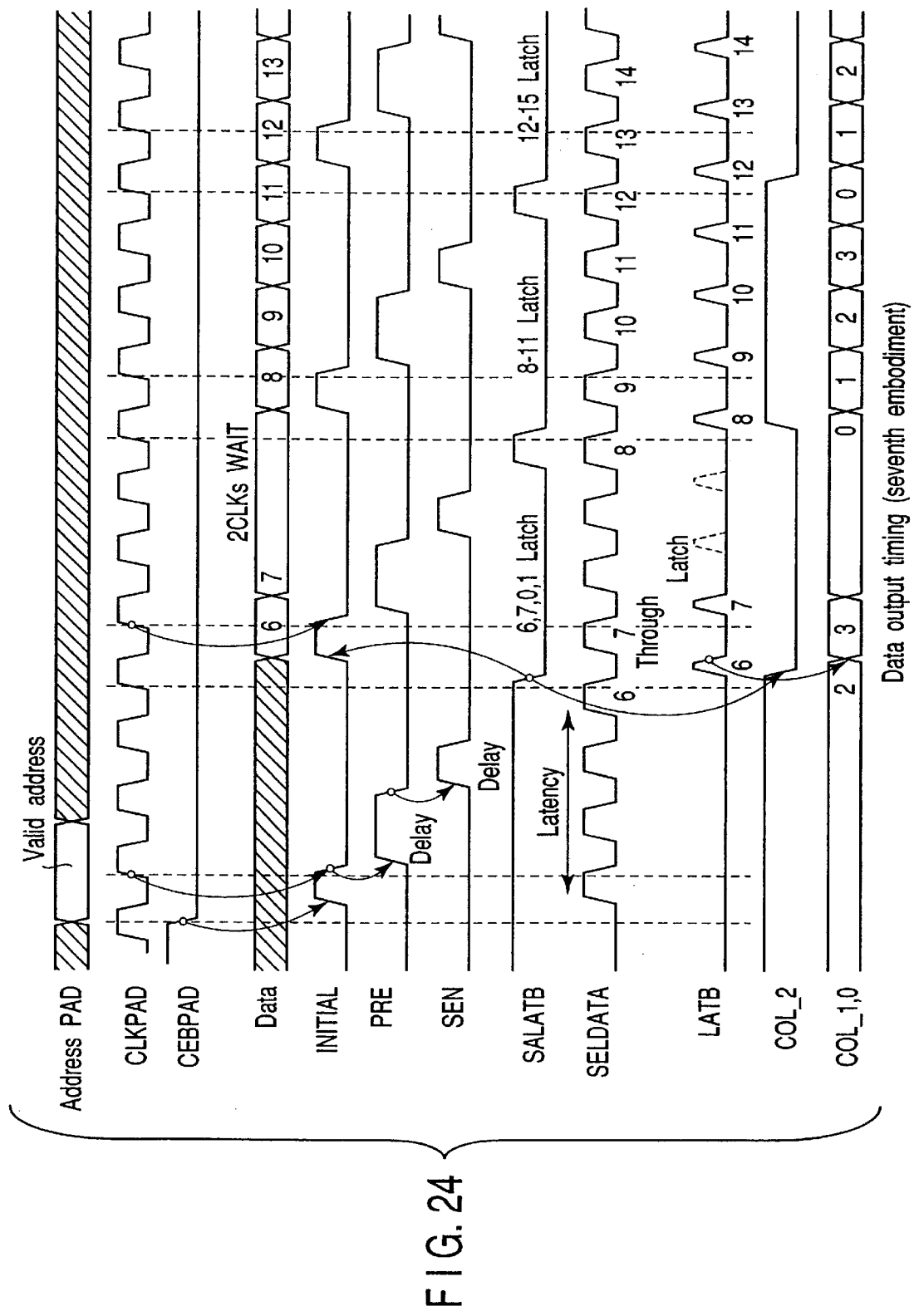
FIG. 24 is an operation timing chart showing a data output timing according to a seventh embodiment.

A timing chart of the timings of the respective signals is shown in FIG. 24.

It is assumed that CEBPAD="LOW", and the input address is latched at a first rising of CLKPAD. A signal INITIAL is an initializing signal of a reading circuit, used in discharging electricity from the sense line connected to the sense amplifier, starting an operation of a constant current source of a differential amplifier, and the like, and can be associated with an a synchronous address transition detect signal ATD. To access and sense the cell, an a synchronous internal delay circuit is used. The bit line is precharged in response to a signal PRE, and the sensing starts, when a signal "SENSE" is "HIGH".

An operation for transferring the sense amplifier output SAOUT to the data latch 17 and selecting the output by the multiplexer 19 is performed in synchronization with the clock signal inputted via CLKPAD. These signals are SALATB, SELDATA, LATB. At a first access time, SALATB="HIGH", and the sense amplifier output SAOUT is transferred to the data latch 17 as it is. Subsequently, after CEBPAD="LOW" and a predetermined number of clocks, with transition to SALATB=L, the data for four addresses is fixed. The fixed number of clocks constitute LATENCY of the first access, and a minimum LATENCY clock number changes with an internal reading rate and clock frequency.

Thereafter, SALATB opens a transfer gate every four clocks, and takes in SAOUT for new four addresses. The high-level address is counted up from COL_2 at a falling of SALATB, and the reading for the next four addresses starts. After SALATB=L, the signal INITIAL is "HIGH" till the rising of the first clock. Thereafter, similarly as the first access, the timings of PRE, SEN by the internal delay are generated.

An operation (LATB) for selecting (SELDATA) one piece of data from the four addresses data, and outputting the data to an I/O pad from an output buffer is performed every clock. The data transferred to DATABUS at a timing of SELDATA is first latched by the latch a of FIG. 23. Moreover, with LATB="HIGH", the data is actually transferred to the output buffer, and with LATB="LOW", the transfer gate is closed. Then, with SELDATA="HIGH", the next data is outputted to the latch a.

Eighth Embodiment

For the timing of the seventh embodiment shown in FIG. 24, the timing (SELDATA) of the output multiplexer for selecting the output data from the data latch 17 is a basic clock of the synchronous operation. Both timings of rising and falling of the input clock from a clock pad are used to control the operation. In a CMOS gate logic, the rising of logic depends on a driving ability of pMOS, and the falling depends on a driving ability of nMOS. Therefore, when a balance of the driving ability of the transistor collapses in a process condition, a difference is generated in a rising delay and falling delay. In this case, in the timing shown in FIG. 24, when the frequency of the basic clock is raised, it is difficult to hold correlation and context of respective control signals.

On the other hand, as shown in FIG. 25, an eighth embodiment provides a control timing in which LATB is used as the basic clock of the synchronous operation. In this case, except the first address latch timing, only a falling edge of the clock input is used, and a control simply depending only on the clock frequency is performed.

According to the present invention described in the first to eighth embodiments, the memory cell on the same word line is sequential selected only by switching the column gate, and the pipeline reading is realized. As compared with the conventional art in which a decoder circuit is separated, the chip area can be reduced, and reading power consumption can be reduced.

Moreover, since the column gate signal is separately driven every address in the simultaneous sensing of the plurality of addresses, the number of address-order outputs, double the number of sense amplifiers, can be outputted without delay.

Furthermore, the present invention is not limited to the first to eighth embodiments, and can variously be modified without departing from the scope of the present invention.

Additionally, the respective embodiments can of course be implemented alone or in an appropriately combined manner.

Moreover, the respective embodiments include various stages of the present invention, and various stages of the present invention can also be extracted by appropriately combining a plurality of constituting elements disclosed in the respective embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents what

What is claimed is:

1. A semiconductor integrated circuit device comprising:
   first to eighth bit lines;
   a plurality of memory cells being connected to the first to eighth bit lines,
   first to eighth column selection transistors, one of a source and drain of each of the first to eighth column selection transistors being connected to a corresponding one of the first to eighth bit lines;
   ninth to twelfth column selection transistors, one of a source and drain of the ninth column selection transistor being connected to the other of the source and drain of each of the first and second column selection transistors, one of a source and drain of the tenth column selection transistor being connected to the other of the source and drain of each of the third and fourth column selection transistors, one of a source and drain of the eleventh column selection transistor being connected to the other of the source and drain of each of the fifth and sixth column selection transistors, one of a source and drain of the twelfth column selection transistor being connected to the other of the source and drain of each of the seventh and eighth column selection transistors;
   first and second sense amplifiers, the first sense amplifier being connected to the other of the source and drain of each of the ninth and tenth column selection transistors, and the second sense amplifier being connected to the other of the source and drain of each of the eleventh and twelfth column selection transistors,
   a first column selection line being connected to gates of the first, third, fifth and seventh column selection transistors,
   a second column selection line being connected to gates of the second, fourth, sixth and eighth column selection transistors, and
   third to sixth column selection lines being connected to gates of the ninth to twelfth column selection transistors, respectively.

2. The device according to claim 1, further comprising:
   first and second redundant bit lines;
   a plurality of memory cells being connected to the first and second redundant bit lines;
   first and second redundant column selection transistors, one of a source and drain of each of the first and second column selection transistors being connected to a corresponding one of the first and second redundant bit lines;
   a third redundant column selection transistor, one of a source and drain of the third column selection transistor being connected to the other of each of the first and second redundant column selection transistors;
   a redundant sense amplifier being connected to the other of the source and drain of the third redundant column selection transistor; and
   a redundant column selection line being connected to a gate of the third redundant column selection transistor;
   wherein a gate of the first redundant column selection transistor is connected to the first column selection line, and a gate of the second redundant column selection transistor is connected to the second column selection line.

3. The device according to claim 2, wherein the plurality of memory cells are non-volatile memory cells.

4. The device according to claim 2, further comprising:
   a first selection transistor driving circuit being connected to the first and second column selection lines, and
   a second selection transistor driving circuit being connected to the third to sixth column selection lines,
   and wherein,
   the first column selection transistor driving circuit drives the first and second column selection lines in accordance with a first address signal group; and
   the second column selection transistor driving circuit drives the third to sixth column selection lines in accordance with a second address signal group differ from the first address signal group.

5. The device according to claim 4, wherein the plurality of memory cells are non-volatile memory cells.

6. The device according to claim 4, wherein:

the redundant column selection line is connected to the second column selection transistor driving circuit; and the second column selection transistor driving circuit drives the third to sixth column selection lines and the redundant column line in accordance with the second address signal group.

7. The device according to claim 6, wherein the plurality of memory cells are non-volatile memory cells.

8. The device according to claim 1, further comprising:

first to fourth write column selection transistors, one of a source and drain of the first write column selection transistor being connected to the other of each of the first and second column selection transistors, one of a source and drain of the second write column selection transistor being connected to the other of each of the third and fourth column selection transistors, one of a source and drain of the third write column selection transistor being connected to the other of each of the fifth and sixth column selection transistors, and one of a source and drain of the fourth write column selection transistor being connected to the other of each of the seventh and eighth column selection transistors, a verifying sense amplifier being connected to the other of the source and drain of each of the first to fourth write column selection transistors; and first to fourth column selection lines being connected to gates of the first to fourth write column selection transistors.

9. The device according to claim 2, further comprising:

a first selection transistor driving circuit being connected to the first and second column selection lines; and a second selection transistor driving circuit being connected to the third to sixth column selection lines;

and wherein:

the first column selection transistor driving circuit drives the first and second column selection lines in accordance with a first address signal group; and;

the second column selection transistor driving circuit drives the third to sixth column selection lines in accordance with a second address signal group differ from the first address signal group.

10. The device according to claim 9, wherein:

the first to fourth write column selection lines are connected to the third column selection transistor driving circuit; and the third column selection transistor driving circuit drives the first to fourth write column selection lines in accordance with a third address signal group differing from the first address signal group.

11. The device according to claim 10, wherein the plurality of memory cells are non-volatile memory cells.

12. The device according to claim 9, wherein the plurality of memory cells are non-volatile memory cells.

13. The device according to claim 8, wherein the plurality of memory cells are non-volatile memory cells.

14. The device according to claim 1, further comprising:

a first selection transistor driving circuit being connected to the first and second column selection lines; and a second selection transistor driving circuit being connected to the third to sixth column selection lines, and wherein:

the first column selection transistor driving circuit drives the first and second column selection lines in accordance with a first address signal group; and the second column selection transistor driving circuit drives the third to sixth column selection lines in accordance with a second address signal group differ from the first address signal group.

15. The device according to claim 14, wherein the plurality of memory cells are non-volatile memory cells.

16. The device according to claim 1, wherein the plurality of memory cells are non-volatile memory cells.

* * * * *